(12) United States Patent
Kawamura et al.

(10) Patent No.: US 10,116,147 B2
(45) Date of Patent: Oct. 30, 2018

(54) BATTERY MANAGING DEVICE AND BATTERY MANAGING METHOD

(71) Applicant: HONDA MOTOR CO., LTD., Tokyo (JP)

(72) Inventors: Masayuki Kawamura, Wako (JP); Yoshikazu Nishida, Wako (JP); Noriyuki Shimizu, Wako (JP)

(73) Assignee: HONDA MOTOR CO., LTD., Tokyo (JP)

( * ) Notice: Subject to any disclaimer, the term of this patent is extended or adjusted under 35 U.S.C. 154(b) by 239 days.

(21) Appl. No.: 15/086,061

(22) Filed: Mar. 31, 2016

(65) Prior Publication Data

US 2016/0344208 A1 Nov. 24, 2016

(30) Foreign Application Priority Data

May 22, 2015 (JP) .................... 2015-104884

(51) Int. Cl.
*H02J 7/00* (2006.01)
*B60L 11/18* (2006.01)
*G01R 31/36* (2006.01)

(52) U.S. Cl.
CPC ......... *H02J 7/0029* (2013.01); *B60L 11/1861* (2013.01); *G01R 31/361* (2013.01); *H02J 7/0077* (2013.01); *H02J 2007/004* (2013.01); *H02J 2007/0037* (2013.01)

(58) Field of Classification Search
CPC .................................... H02J 7/0029

USPC ......................................... 320/109
See application file for complete search history.

(56) References Cited

U.S. PATENT DOCUMENTS

2003/0169018 A1* 9/2003 Berels ............. H02J 1/14
                                                          320/132
2014/0025243 A1* 1/2014 Hose ............. B60W 10/06
                                                          701/22

FOREIGN PATENT DOCUMENTS

WO    WO 2012/008462    1/2012

* cited by examiner

*Primary Examiner* — Suchin Parihar
(74) *Attorney, Agent, or Firm* — Mori & Ward, LLP

(57) ABSTRACT

A battery managing device includes a first calculator, a second calculator, a determiner, and a controller. The first calculator calculates a provisional value indicating a charge state of a battery provided in a vehicle including an electric motor as a drive source. The second calculator calculates the charge state of the battery based on a condition obtained by comparing the provisional value and a boundary point which is on a boundary between a plurality of regions divided in accordance with an available charged amount of the battery. The boundary point is determined based on the available charged amount of the battery in a predetermined degradation state. The determiner determines in which region among the regions the charge state of the battery locates. The controller controls to charge and discharge the battery in accordance with the region determined by the determiner.

23 Claims, 9 Drawing Sheets

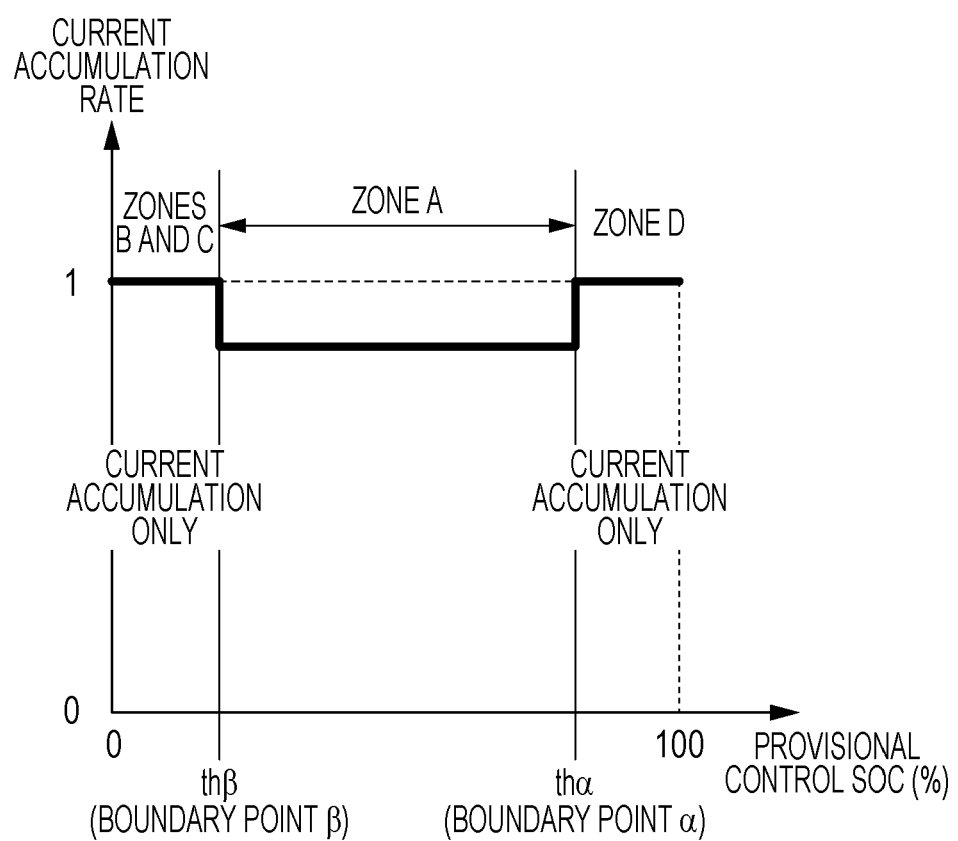

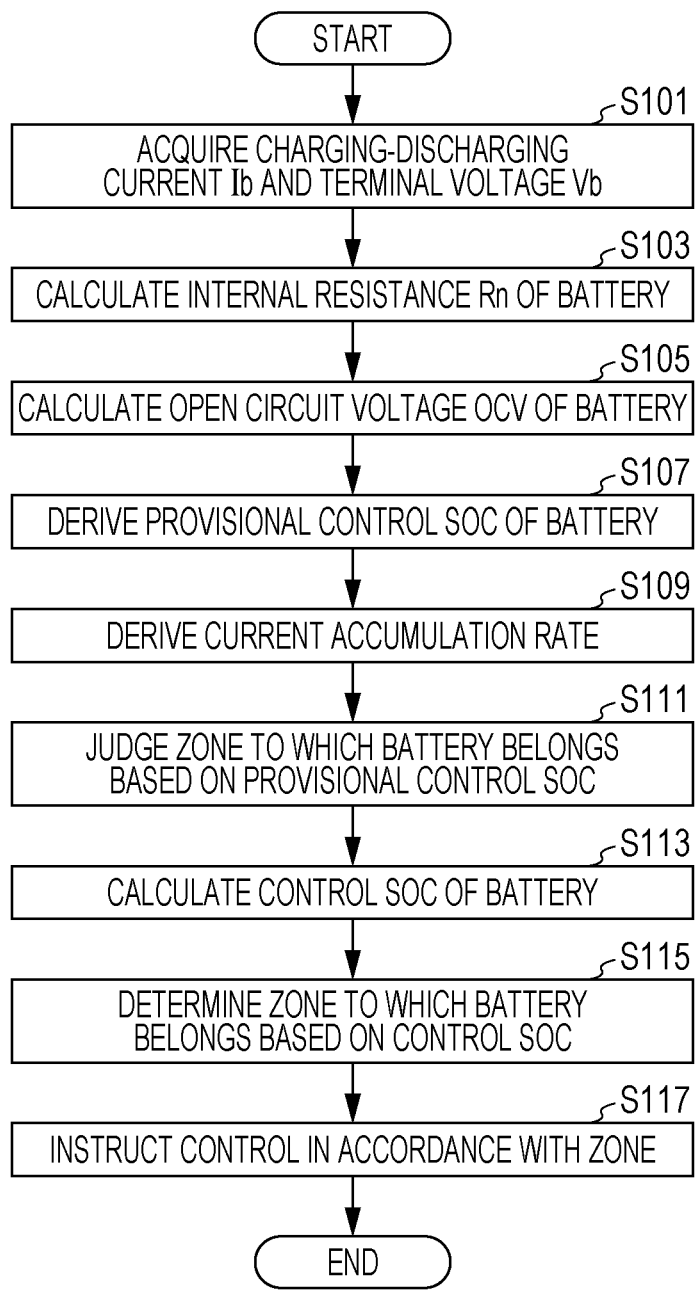

BATTERY MANAGING DEVICE AND BATTERY MANAGING METHOD

CROSS-REFERENCE TO RELATED APPLICATIONS

The present application claims priority under 35 U.S.C. § 119 to Japanese Patent Application No. 2015-104884, filed May 22, 2015, entitled "Battery Managing Device, Battery Managing Method, and Vehicle." The contents of this application are incorporated herein by reference in their entirety.

BACKGROUND

1. Field

The present invention relates to a battery managing device and a battery managing method.

2. Description of the Related Art

International Publication No. WO 2012/008462 discloses a charged capacity managing device of a battery provided to a vehicle including an electric motor as a drive source. This charged capacity managing device includes an internal resistance calculator that estimates the degradation state of the battery, a zone setter that sets a plurality of zones dividing an available charged capacity of the battery in accordance with the degradation state of the battery, a belonged zone determiner that derives a control SOC in accordance with the open circuit voltage of the battery and determines to which of the zones set by the zone setter the control SOC thus derived belongs, and a control instructor that instructs a control on charging and discharging of the battery in accordance with the zone determined by the belonged zone determiner. The range of the charged capacity of at least one predetermined zone among the zones set by the zone setter is set constant irrespective of the degradation state of the battery, whereas the range of the charged capacity of a zone other than the predetermined zone is different depending on the degradation state of the battery.

SUMMARY

According to a first aspect of the present invention, a battery managing device includes a first deriver, a second deriver, a determiner, and an instructor. The first deriver derives a provisional value indicating a charge state of a battery provided to a vehicle including an electric motor as a drive source. The second deriver derives the charge state of the battery based on a condition obtained by comparing the provisional value and a boundary point between a plurality of ranges divided in accordance with an available charged amount of the battery. The determiner determines to which of the ranges the battery belongs based on the charge state of the battery derived by the second deriver. The instructor instructs a control on charging and discharging of the battery in accordance with the region determined by the determiner. The boundary point is set based on a minimum required available charged amount for the battery belonging to at least one specific range of the ranges. The minimum required available charged amount is an available capacity of the battery in a predetermined degradation state belonging to the specific range.

According to a second aspect of the present invention, a battery managing method includes deriving a provisional value indicating a charge state of a battery provided to a vehicle including an electric motor as a drive source. The charge state of the battery is derived based on a condition obtained by comparing the provisional value and a boundary point between a plurality of ranges divided in accordance with an available charged amount of the battery. The battery managing method includes determining to which of the ranges the battery belongs to based on the charge state of the battery derived by the deriving. A control on charging and discharging of the battery is instructed in accordance with the region determined by the determining. The boundary point is set based on a minimum required available charged amount for the battery belonging to at least one specific range of the ranges. The minimum required available charged amount is an available capacity of the battery in a predetermined degradation state belonging to the specific range.

According to a third aspect of the present invention, a battery managing device includes a first calculator, a second calculator, a determiner, and a controller. The first calculator calculates a provisional value indicating a charge state of a battery provided in a vehicle including an electric motor as a drive source. The second calculator calculates the charge state of the battery based on a condition obtained by comparing the provisional value and a boundary point which is on a boundary between a plurality of regions divided in accordance with an available charged amount of the battery. The boundary point is determined based on the available charged amount of the battery in a predetermined degradation state. The determiner determines in which region among the regions the charge state of the battery locates. The controller controls to charge and discharge the battery in accordance with the region determined by the determiner.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings.

FIG. 8 illustrates another exemplary current accumulation rate map for the control SOC.

FIG. 9 is a flowchart of an operation of the battery managing device.

DESCRIPTION OF THE EMBODIMENTS

Figure 1:
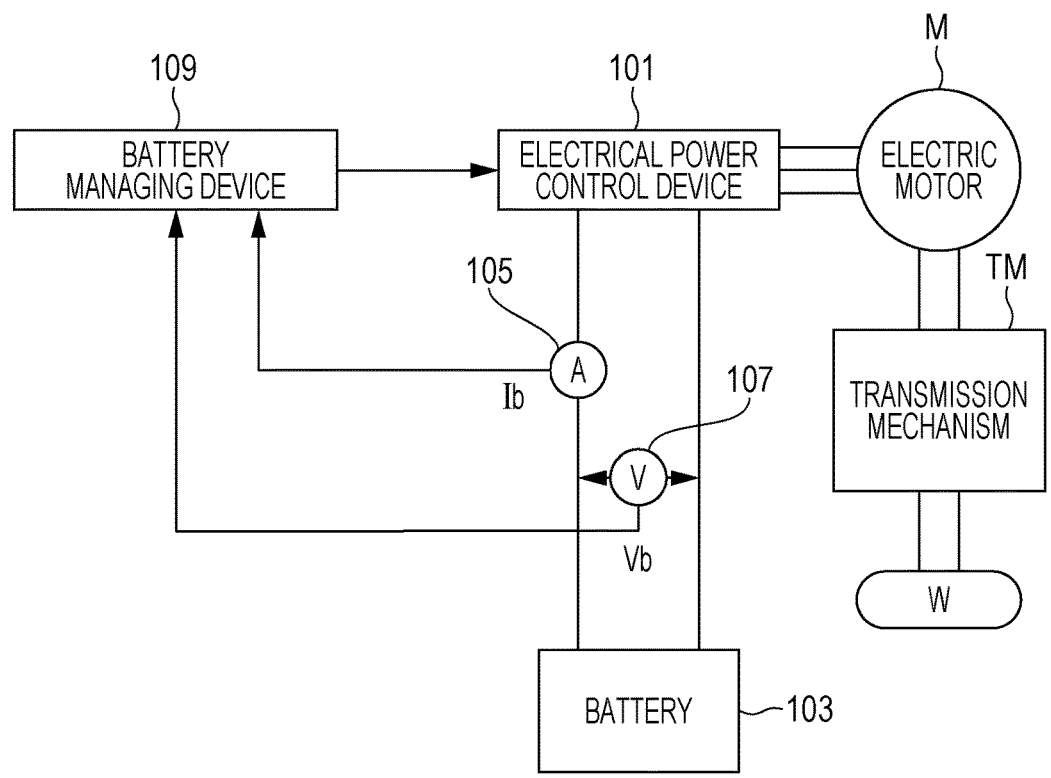
FIG. 1 is a schematic configuration diagram of a vehicle on which a battery managing device according to an embodiment of the present disclosure is mounted.

The embodiments will now be described with reference to the accompanying drawings, wherein like reference numerals designate corresponding or identical elements throughout the various drawings.

Exemplary embodiments of the present disclosure will be described below with reference to the accompanied drawings. A battery managing device according to an embodiment described below is mounted on a vehicle such as an electric vehicle (EV) or a hybrid electrical vehicle (HEV) including, as a drive source, an electric motor driven by electrical power supplied from a battery.

FIG. 1 is a schematic configuration diagram of a vehicle on which a battery managing device according to the embodiment of the present disclosure is mounted. The vehicle illustrated in FIG. 1 mainly includes an electric motor M, a transmission mechanism TM, a drive wheel W, an electrical power control device 101, a battery 103, a current sensor 105, a voltage sensor 107, and a battery managing device 109. In this vehicle, drive power from the electric motor M is transferred to the drive wheel W through the transmission mechanism TM. Drive power transferred from the drive wheel W to the electric motor M during deceleration causes the electric motor M to function as a dynamo to generate what is called a regenerative breaking force, which recovers the kinetic energy of the vehicle as regenerative energy into the battery 103.

Next follows a description of components included in the vehicle.

The electrical power control device 101 controls the electrical power supply from the battery 103 to the electric motor M for driving the electric motor M, and the recovery of the regenerative energy from the electric motor M to the battery 103.

Figure 2:
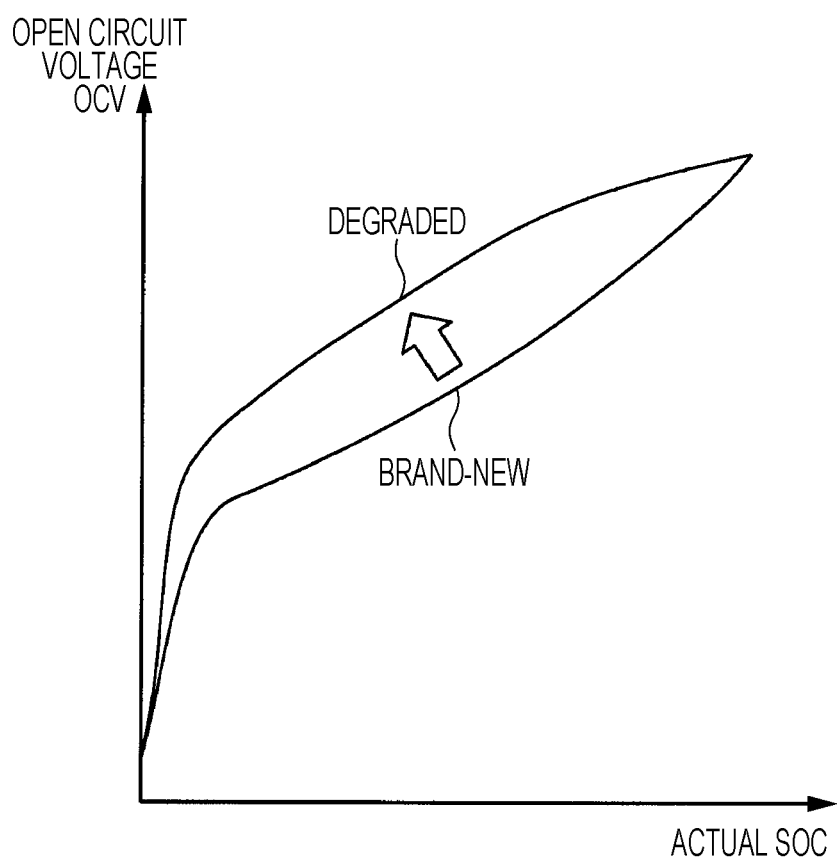
FIG. 2 illustrates a change characteristic of an open circuit voltage of the battery plotted against an actual SOC thereof when the battery is brand-new and degraded.

The battery 103 is a secondary battery such as a nickel-hydride battery or a lithium-ion battery. Use of the battery 103 as a secondary battery requires constant monitoring of a remaining capacity (state of charge, which is abbreviated as SOC) of the battery 103, and prevention control of overcharging and overdischarging. Under these monitoring and control, charging and discharging of the battery 103 are repeated in the range (0% to 100%) of a control SOC within which the battery 103 is usable. The control SOC of the battery 103 is derived based on an accumulated value of the charging-discharging current of the battery 103 and/or the open circuit voltage (OCV) of the battery 103. As illustrated in FIG. 2, the relation between the open circuit voltage and an actual SOC of the battery 103 is different depending on the degradation state of the battery 103. The control SOC and the actual SOC of the battery 103 have a difference therebetween.

The current sensor 105 detects a charging-discharging current Ib of the battery 103. The charging-discharging current Ib includes a discharging current supplied from the battery 103 to the electric motor M and a charging current supplied from the electric motor M that performs regeneration to the battery 103.

The voltage sensor 107 detects a terminal voltage Vb (also referred to as closed circuit voltage, which is abbreviated as CCV) of the battery 103. The current sensor 105 and the voltage sensor 107 have substantially simultaneous detection timings.

Figure 3:
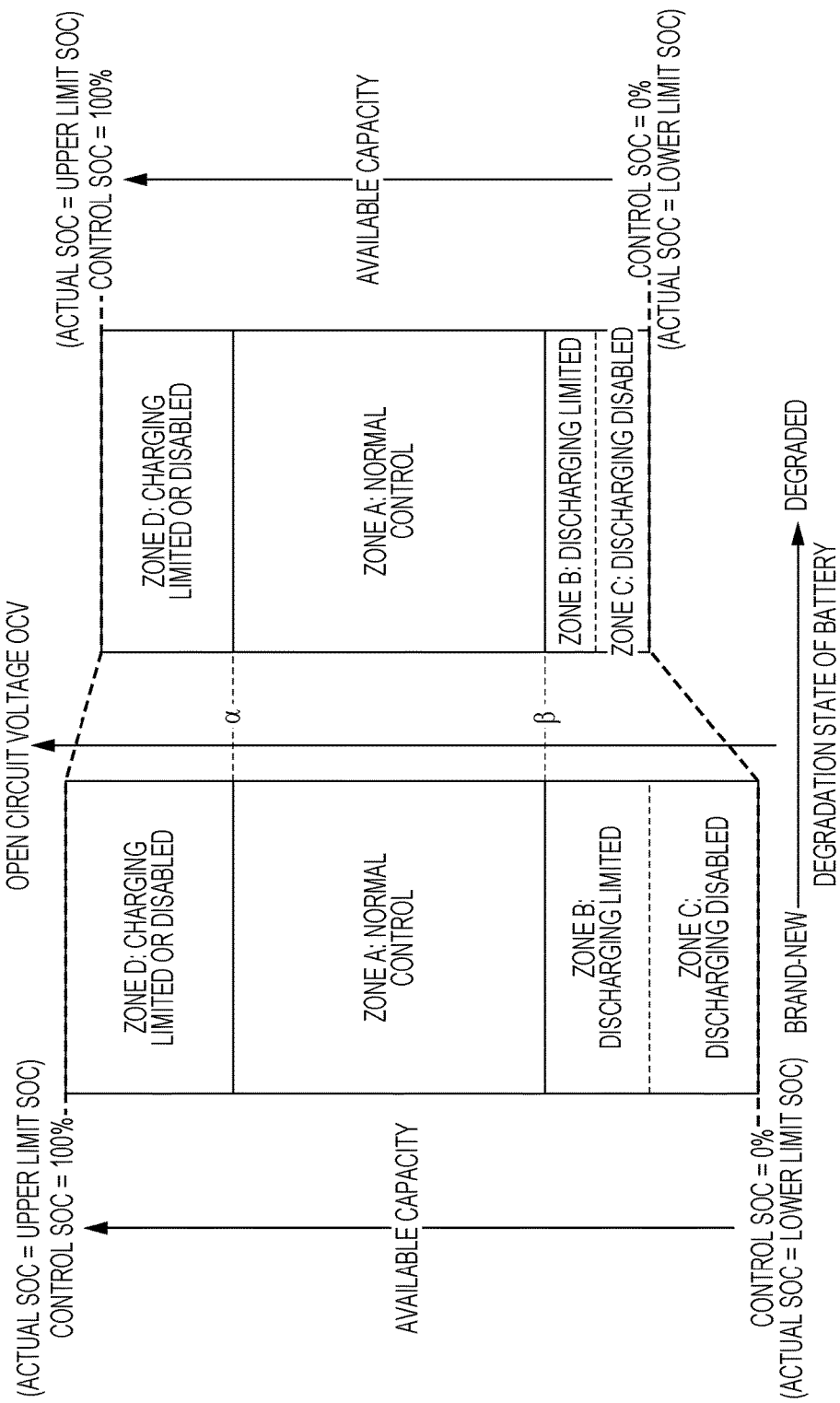
FIG. 3 illustrates a relation among a range of a control SOC, an open circuit voltage OCV, and a plurality of zones when the battery is brand-new and degraded.

The battery managing device 109 derives the control SOC of the battery 103 and determines to which of a plurality of previously set ranges (hereinafter referred to as "zones") the battery 103 belongs. FIG. 3 illustrates the relation among the range of the control SOC when the battery 103 is brand-new and degraded, the open circuit voltage OCV, and the zones. As illustrated in FIG. 3, the range of the control SOC within which the battery 103 is usable is divided into four zones of zone C, zone B, zone A, and zone D in this order from 0% to 100%. The battery managing device 109 performs a control described below on the electrical power control device 101 in accordance with a determined zone.

Discharging is disabled for the battery 103 belonging to zone C. The battery 103 belonging to zone B is in a charged state that guarantees electrical power supply to the electric motor M when the vehicle climbs or starts moving. Thus, discharging is limited for the battery 103 belonging to zone B. The battery 103 belonging to zone A is in a charged state that allows normal travel on a level ground and in an urban area. Thus, a normal control is performed on the battery 103 belonging to zone A. The battery 103 belonging to zone D is in a charged state in which charging through, for example, regeneration of the electric motor M during deceleration is limited or disabled. Thus, charging is limited or disabled for the battery 103 belonging to zone D.

Figure 4:
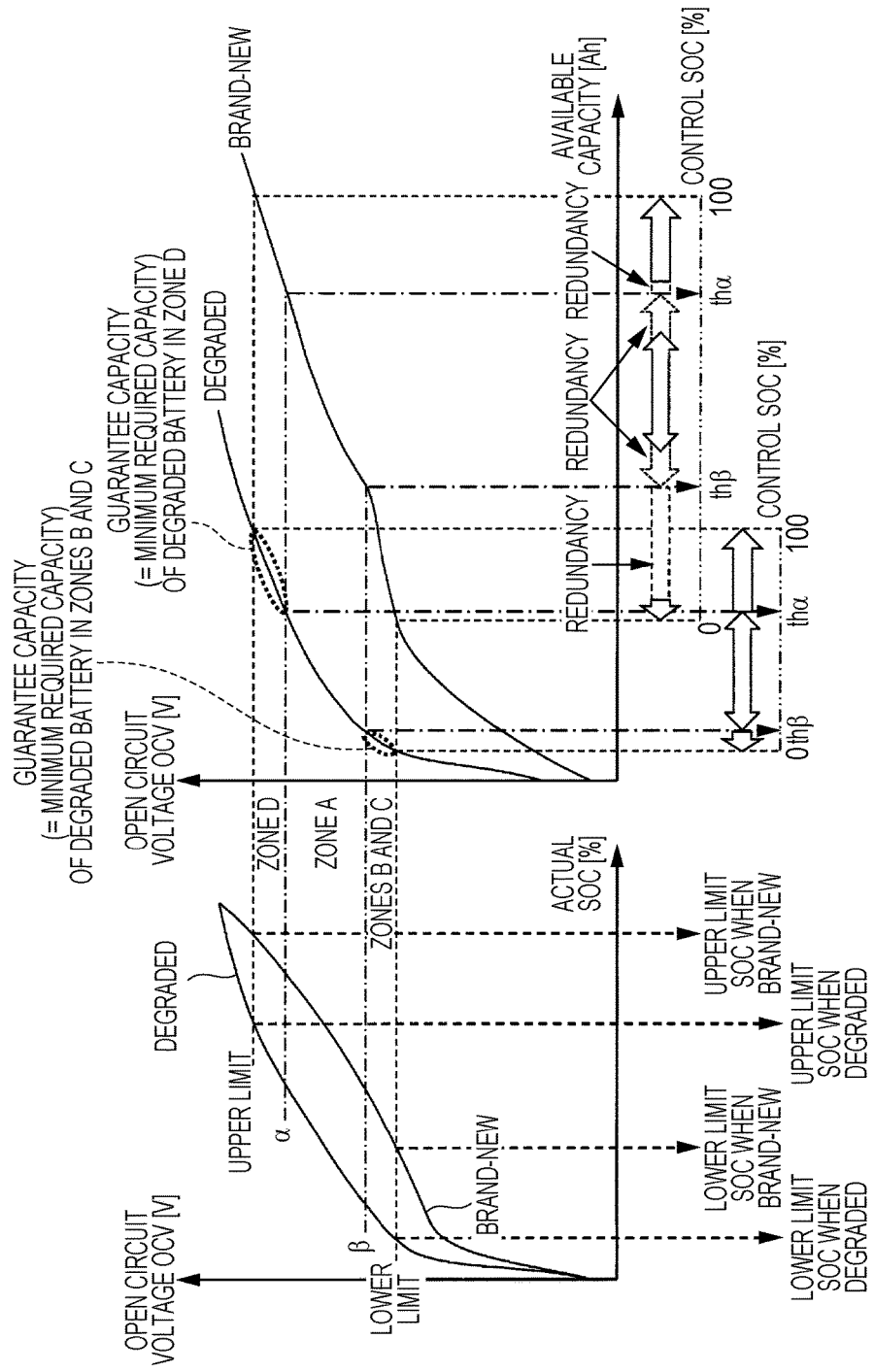
FIG. 4 illustrates the change characteristic of the open circuit voltage plotted against the actual SOC, and the change characteristic of the open circuit voltage plotted against a capacity when the battery is brand-new and degraded.

In the present embodiment, as illustrated in FIG. 2, the relation between the open circuit voltage and the actual SOC of the battery 103 is different depending on the degradation state of the battery 103, and thus the battery 103 has different available capacities for the same open circuit voltage between when brand-new and when degraded, as illustrated in FIG. 3. For this reason, when a boundary point between zone D and zone A and a boundary point between zones B and C (hereinafter collectively referred to as zone BC) and zone A are set based on the open circuit voltage of the brand-new battery 103, a minimum required capacity cannot be obtained for the degraded battery 103 belonging to zone D and zone BC. For example, when the boundary point between zone BC and zone A is set based on the open circuit voltage of the brand-new battery 103, the minimum required capacity cannot be obtained for the degraded battery 103 belonging to zone BC. Thus, in the present embodiment, a boundary point α between zone D and zone A and a boundary point β between zone BC and zone A are set based on an available capacity in accordance with the open circuit voltage of the degraded battery 103. As a result, as illustrated in FIG. 4, the brand-new battery 103 has redundancy in the available capacity in each zone. Thus, a guarantee capacity of the zone, which is the minimum required capacity of the zone, can be maintained at the boundary point α in zone D and the boundary point β in zone BC when this battery 103 is degraded. The "degraded" battery 103 or the battery 103 "when degraded" in description of the present embodiment means the battery 103 for which the available capacity at an upper limit SOC (the control SOC=100%) of the actual SOC illustrated in FIG. 4 is less than or equal to half of that when the battery 103 is brand-new, at which the degradation state of the battery 103 is at a minimum allowable level.

Figure 5:
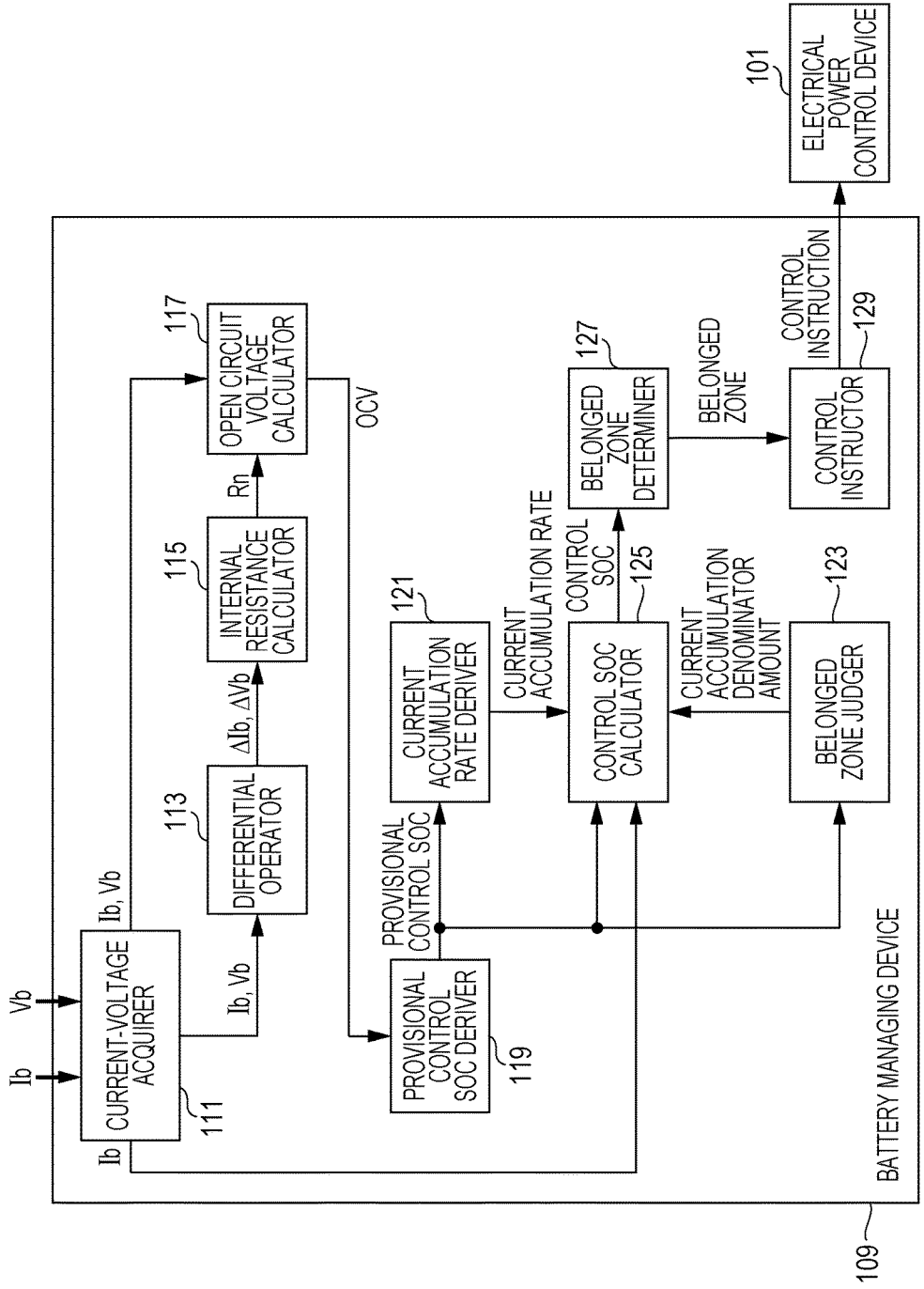
FIG. 5 is a block diagram of an internal configuration of the battery managing device.

FIG. 5 is a block diagram of an internal configuration of the battery managing device 109. As illustrated in FIG. 5, the battery managing device 109 includes a current-voltage acquirer 111, a differential operator 113, an internal resistance calculator 115, an open circuit voltage calculator 117, a provisional control SOC deriver 119, a current accumulation rate deriver 121, a belonged zone judger 123, a control SOC calculator 125, a belonged zone determiner 127, and a control instructor 129.

the current-voltage acquirer 111 acquires the charging-discharging current Ib detected by the current sensor 105 and the terminal voltage Vb detected by the voltage sensor 107. The differential operator 113 differentiates the charging-discharging current Ib and the terminal voltage Vb acquired by the current-voltage acquirer 111. The internal resistance calculator 115 calculates an internal resistance Rn of the battery 103 by Equation (1) below based on a differential value ΔIb of the charging-discharging current Ib and a differential value ΔVb of the terminal voltage Vb calculated by the differential operator 113.

$$Rn = \Delta Vb / \Delta Ib \quad (1)$$

Figure 6:
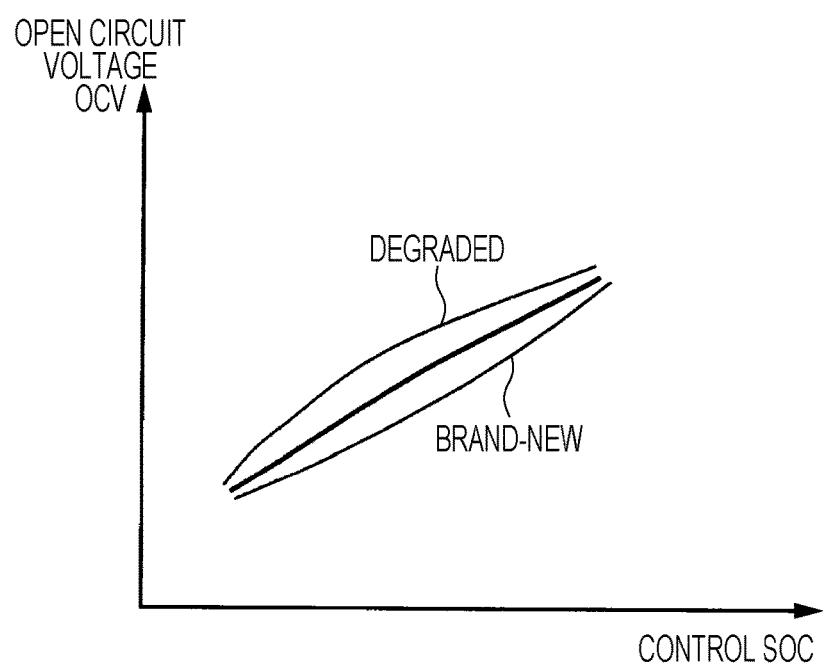
FIG. 6 illustrates the change characteristic of the open circuit voltage plotted against the control SOC when the battery is brand-new, degraded, and further degraded.

The open circuit voltage calculator 117 calculates the open circuit voltage OCV of the battery 103 by Equation (2) below based on the internal resistance Rn calculated by the internal resistance calculator 115 and the charging-discharging current Ib and the terminal voltage Vb acquired by the current-voltage acquirer 111.

$$OCV = Vb + Ib \times Rn \quad (2)$$

the provisional control SOC deriver 119 derives a provisional value (hereinafter referred to as "provisional control SOC") of the control SOC of the battery 103, using a map, from the open circuit voltage OCV calculated by the open circuit voltage calculator 117. The map used by the provisional control SOC deriver 119 is produced based on a value indicated by a curve positioned between the curve of the brand-new battery 103 and the curve of the degraded battery 103 among the control SOC-OCV curves that depend on the degradation state of the battery 103 as illustrated in FIG. 6. In the present embodiment, the map is produced based on the value indicated by the curve of the battery 103 in the degradation state between brand-new and degraded with a smallest error in the control SOC relative to the open circuit voltage OCV. This achieves a minimum error in the provisional control SOC in accordance with the degradation state of the battery 103.

Figure 7:
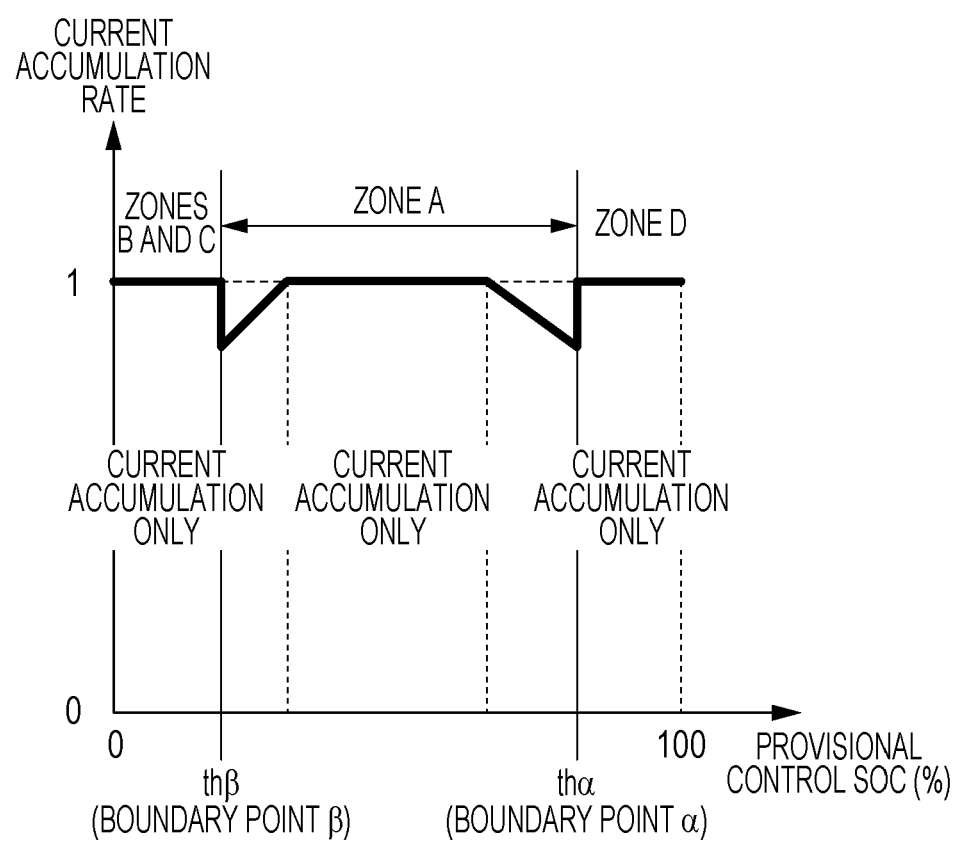
FIG. 7 illustrates an exemplary current accumulation rate map for the control SOC.

The current accumulation rate deriver 121 derives, from the provisional control SOC derived by the provisional control SOC deriver 119, using a current accumulation rate map illustrated in FIG. 7, a current accumulation rate indicating a ratio of the accumulated value of the charging-discharging current Ib of the battery 103 used when the control SOC calculator 125 calculates the control SOC. The current accumulation rate is a value in the range of 0 to 1 as illustrated in FIG. 7, and the current accumulation rate deriver 121 derives 1 when the provisional control SOC is larger than a threshold thα corresponding to the boundary point α between zone D and zone A or when the provisional control SOC is smaller than a threshold thβ corresponding to the boundary point β between zone BC and zone A. When the provisional control SOC is equal to or larger than the threshold thβ and equal to or smaller than the threshold thα, the current accumulation rate deriver 121 derives a smaller value for the provisional control SOC closer to the thresholds thα and thβ. Depending on a change of the relation between the open circuit voltage and the actual SOC based on the degradation state of the battery 103, the current accumulation rate deriver 121 may use a current accumulation rate map illustrated in FIG. 8. The current accumulation rate map illustrated in FIG. 8 is preferable for a battery with a large gradient of the control SOC-OCV curve. In addition to the current accumulation rate maps illustrated in FIGS. 7 and 8, various maps can be set as a current accumulation rate map used by the current accumulation rate deriver 121, depending on the characteristic and use condition of a battery, for example.

The belonged zone judger 123 judges a zone to which the battery 103 belongs, from the provisional control SOC derived by the provisional control SOC deriver 119. The belonged zone judger 123 judges that the battery 103 belongs to zone D when the provisional control SOC is larger than the threshold thα corresponding to the boundary point α between zone D and zone A as illustrated in FIGS. 7 and 8. The belonged zone judger 123 judges that the battery 103 belongs to zone BC when the provisional control SOC is smaller than the threshold thβ corresponding to the boundary point β between zone BC and zone A. The belonged zone judger 123 judges that the battery 103 belongs to zone A when the provisional control SOC is equal to or larger than the threshold thβ and equal to or smaller than the threshold thα. In addition, the belonged zone judger 123 judges a current accumulation denominator amount in accordance with the belonged zone thus judged. The current accumulation denominator amount is used when the control SOC calculator 125 calculates the control SOC using an accumulated value of the charging-discharging current Ib of the battery 103.

The control SOC calculator 125 calculates the control SOC of the battery 103 by Equation (3) below at each predetermined time. The "previous control SOC" on the right hand side of Equation (3) is the latest control SOC calculated by the control SOC calculator 125. A difference "accumulated discharging amount−accumulated charging amount" on the right hand side of Equation (3) is a value obtained by dividing, by the current accumulation denominator amount determined by the belonged zone judger 123, an accumulated value of the charging-discharging current Ib where the charging-discharging current Ib when the battery 103 is discharging is taken to be positive, and the charging-discharging current Ib when the battery 103 is charging is taken to be negative.

$$\begin{aligned}\text{Control SOC} = &\{\text{Previous Control SOC} \times \text{Current Accumulation Rate}\} + \{\text{Provisional Control SOC} \times (1 - \text{Current Accumulation Rate})\} - \{\text{Accumulated Discharging Amount} - \text{Accumulated Charging Amount}\}\end{aligned} \quad (3)$$

The control SOC calculated using Equation (3) is calculated by subtracting the difference "accumulated discharging amount−accumulated charging amount" from the previous control SOC when the current accumulation rate is one. When the current accumulation rate is, for example, 0.9, the control SOC is calculated by subtracting the difference "accumulated discharging amount−accumulated charging amount" from the sum of 90% of the previous control SOC and 10% of the provisional control SOC derived by the provisional control SOC deriver 119. Thus, when the current accumulation rate in the current accumulation rate maps illustrated in FIG. 7 or 8 is set to be one, the control SOC is calculated as the accumulated value of the charging-discharging current Ib. When the current accumulation rate is less than one, the control SOC partially corrected by the provisional control SOC is calculated.

The belonged zone determiner 127 determines to which zone the battery 103 belongs, from the control SOC calculated by the control SOC calculator 125.

The control instructor 129 instructs the electrical power control device 101 to control charging and discharging of the battery 103 based on, for example, the vehicle speed, an acceleration pedal position, a force on brake pedal, the control SOC, and a shift position, in accordance with the zone determined by the belonged zone determiner 127.

FIG. 9 is a flowchart of an operation of the battery managing device 109. As illustrated in FIG. 9, the current-voltage acquirer 111 of the battery managing device 109 acquires the charging-discharging current Ib detected by the current sensor 105 and the terminal voltage Vb detected by the voltage sensor 107 (step S101). Next, the differential operator 113 differentiates the charging-discharging current Ib and the terminal voltage Vb, and the internal resistance calculator 115 calculates the internal resistance Rn of the battery 103 from the differential value ΔIb of the charging-discharging current Ib and the differential value ΔVb of the terminal voltage Vb (step S103). Next, the open circuit voltage calculator 117 calculates the open circuit voltage OCV of the battery 103 based on the internal resistance Rn, the charging-discharging current Ib, and the terminal voltage Vb (step S105).

Next, the provisional control SOC deriver 119 derives the provisional control SOC from the open circuit voltage OCV of the battery 103 (step S107). Next, the current accumulation rate deriver 121 derives the current accumulation rate in accordance with the provisional control SOC (step S109). Next, the belonged zone judger 123 judges a zone to which the battery 103 belongs from the provisional control SOC, and determines the current accumulation denominator amount in accordance with the belonged zone thus judged (step S111). Next, the control SOC calculator 125 calculates the control SOC of the battery 103 by Equation (3) described above (step S113).

Next, the belonged zone determiner 127 determines to which zone the battery 103 belongs from the control SOC calculated at step S113 (step S115). Finally, the control instructor 129 instructs the electrical power control device 101 to perform a control in accordance with the zone determined at step S115 (step S117).

As described above, in the present embodiment, the boundary points α and β of the zones in which different controls are performed on the battery 103 are set based on the characteristic of the degraded battery 103 so that the minimum required capacity in each zone (zone D and zone BC, in particular) can be maintained even when the battery 103 is degraded. Accordingly, the battery managing device 109 for which the boundary points α and β are set derives the provisional control SOC corresponding to the open circuit voltage OCV calculated based on the charging-discharging current Ib and the terminal voltage Vb of the battery 103, and compares the provisional control SOC and the thresholds corresponding to the boundary points α and β, thereby calculating an appropriate control SOC. Thus, in the present embodiment, when the battery 103 for which the relation between the open circuit voltage and the actual SOC is different depending on the degradation state is used, the minimum required capacity in each zone can be maintained even when the battery 103 is degraded. Accordingly, even when degraded so that the relation between the open circuit voltage and the available capacity has changed, the battery 103 can sufficiently provide required performance.

The present disclosure is not limited to the embodiment described above, and variations and modifications thereof are possible as appropriate.

A battery according to a first aspect includes: a first deriver (for example, an open circuit voltage calculator 117 and a provisional control SOC deriver 119) that derives a provisional value (for example, a provisional control SOC) indicating a charge state of a battery (for example, a battery 103) provided to a vehicle including an electric motor (for example, an electric motor M) as a drive source; a second deriver (for example, a control SOC calculator 125) that derives the charge state of the battery (for example, a control SOC) based on a condition obtained by comparing the provisional value and a boundary point (for example, boundary points α and β) between a plurality of ranges (for example, zones) divided in accordance with an available charged amount (for example, an available capacity) of the battery; a determiner (for example, a belonged zone determiner 127) that determines to which of the ranges the battery belongs based on the charge state of the battery derived by the second deriver; an instructor (for example, a control instructor 129) that instructs a control on charging and discharging of the battery in accordance with the range determined by the determiner, characterized in that the boundary point is set based on a minimum required available charged amount for the battery belonging to at least one specific range of the ranges, and the minimum required available charged amount is an available capacity of the battery in a predetermined degradation state belonging to the specific range.

In the battery according to the first aspect, the boundary point between the ranges divided in accordance with the available charged amount of the battery is set based on the characteristic of the battery in the predetermined degradation state so that a minimum required capacity in the specific range can be obtained even when the battery is degraded. The battery managing device for which the boundary point is set in this manner derives the provisional value indicating the charge state of the battery, and derives the charge state of the battery based on the condition obtained by comparing the provisional value and the boundary point. Thus, with a battery of which characteristic varies depending on the degradation state, the minimum required capacity in the specific range can be maintained even when the battery is degraded. This allows required performance to be sufficiently provided even when the battery is degraded and the characteristic has changed.

A battery according to a second aspect is the battery according to the first aspect, characterized in that the instructor limits or disables charging of the battery when the battery is determined to belong to the specific range (for example, zone D).

In the battery according to the second aspect, a minimum required capacity in a range in which charging of the battery is limited or disabled can be maintained even when the battery is degraded.

A battery according to a third aspect is the battery according to the first aspect, characterized in that when the battery is determined to belong to the specific range (for example, zones B and C), the instructor limits or disables discharging of the battery.

In the battery according to the third aspect, a minimum required capacity in a range in which discharging of the battery is limited or disabled can be maintained even when the battery is degraded.

A battery according to a fourth aspect is the battery according to the first to third aspects, further including a third deriver that derives an open circuit voltage of the battery, characterized in that the first deriver derives the provisional value based on a relation between the open circuit voltage of the battery and the charge state of the battery from the open circuit voltage derived by the third deriver.

The battery according to the fourth aspect can derive the provisional value of the charge state of the battery based on the relation between the open circuit voltage of the battery and the charge state of the battery.

A battery according to a fifth aspect is the battery according to the first to fourth aspects, characterized in that the second deriver derives the charge state of the battery based on an accumulated value of a charging-discharging current of the battery when the comparison between the boundary point and the provisional value judges that the battery belongs to the specific range.

The battery according to the fifth aspect can accurately estimate the charge state of the battery belonging to the specific range.

A battery according to a sixth aspect is the battery according to the first to fifth aspects, characterized in that the second deriver derives the charge state of the battery based on the provisional value and an accumulated value of a charging-discharging current of the battery when the comparison between the boundary point and the provisional value judges that the battery does not belong to the specific range.

The battery according to the sixth aspect can accurately estimate the charge state of the battery not belonging to the specific range.

A battery according to a seventh aspect is the battery according to the sixth aspect, characterized in that the second deriver uses a larger ratio of derivation based on the provisional value for the provisional value closer to the boundary point when the battery is judged not to belong to the specific range.

The battery according to the seventh aspect can appropriately derive the charge state of the battery not belonging to the specific range and closer to the boundary point. In addition, continuity can be achieved between the charge state of the battery belonging to the specific range and the charge state of the battery not belonging to the specific range.

A battery according to an eighth aspect is the battery according to the first to seventh aspects, characterized in that the battery in the predetermined degradation state is in such a state that a value indicating the charge state of the battery being fully charged is less than or equal to half of a value indicating the charge state of the battery being fully charged when not degraded.

In the battery according to the eighth aspect, the minimum required capacity in the specific range can be maintained even in such a state that the value indicating the charge state of the battery when fully charged is less than or equal to half of the value indicating the charge state of the battery being fully charged when not degraded.

A battery according to a ninth aspect is the battery according to the first to eighth aspects, characterized in that a relation between an open circuit voltage of the battery and the charge state of the battery varies depending on a degradation state of the battery.

The battery according to the ninth aspect can sufficiently provide required performance of a battery for which the relation between the open circuit voltage and the charge state varies depending on the degradation state.

A battery according to a 10th aspect is the battery according to the eighth aspect, characterized in that the predetermined degradation state is a degradation state of the battery at a minimum allowable level.

In the battery according to the 10th aspect, the minimum required capacity in the specific range can be maintained even when the degradation state of the battery is at the minimum allowable level.

A battery according to an 11th aspect is the battery according to the fourth aspect, characterized in that the relation between the charge state of the battery and the open circuit voltage of the battery, which is used by the first deriver to derive the provisional value, is such a relation that the battery is in a degradation state with a smallest error in a value indicating charge state with respect to the open circuit voltage between an initial state and the predetermined degradation state.

The battery according to the 11th aspect can achieve the smallest error in the provisional value in accordance with the degradation state of the battery.

A battery according to a 12th aspect includes the battery managing device according to the first to 11th aspects.

In the battery according to aspect 12, the boundary point between the ranges divided in accordance with the available charged amount of the battery is set based on the characteristic of the battery in the predetermined degradation state so that a minimum required capacity in the specific range can be obtained even when the battery is degraded. The battery managing device for which the boundary point is set in this manner derives the provisional value indicating the charge state of the battery, and derives the charge state of the battery based on the condition obtained by comparing the provisional value and the boundary point. Thus, with a battery of which characteristic varies depending on the degradation state, the minimum required capacity in the specific range can be maintained even when the battery is degraded. This allows required performance to be sufficiently provided even when the battery is degraded and the characteristic has changed.

A battery according to a 13th aspect includes the steps of: deriving a provisional value indicating (for example, a provisional control SOC) a charge state of a battery (for example, the battery 103) provided to a vehicle including an electric motor (for example, the electric motor M) as a drive source; deriving a charge state of the battery (for example, the control SOC) based on a condition obtained by comparing the provisional value and a boundary point (for example, the boundary points α and β) between a plurality of ranges (for example, the zones) divided in accordance with an available charged amount (for example, the available capacity) of the battery; determining to which of the ranges the battery belongs to based on the charge state of the battery derived by the deriving; and instructing a control on charging and discharging of the battery in accordance with the range determined by the determining, characterized in that the boundary point is set based on a minimum required charged amount for the battery belonging to at least one specific range of the ranges, and the minimum required charged amount is an available capacity of the battery in a predetermined degradation state belonging to the specific range.

In the batteries according to aspect 13, the boundary point between the ranges divided in accordance with the available charged amount of the battery is set based on the characteristic of the battery in the predetermined degradation state so that a minimum required capacity in the specific range can be obtained even when the battery is degraded. The battery managing device for which the boundary point is set in this manner derives the provisional value indicating the charge state of the battery, and derives the charge state of the battery based on the condition obtained by comparing the provisional value and the boundary point. Thus, with a battery of which characteristic varies depending on the degradation state, the minimum required capacity in the specific range can be maintained even when the battery is degraded. This allows required performance to be sufficiently provided even when the battery is degraded and the characteristic has changed.

Obviously, numerous modifications and variations of the present invention are possible in light of the above teachings. It is therefore to be understood that within the scope of the appended claims, the invention may be practiced otherwise than as specifically described herein.

What is claimed is:

1. A battery managing device comprising:
a first deriver that derives a provisional value indicating a charge state of a battery provided to a vehicle including an electric motor as a drive source;
a second deriver that derives the charge state of the battery based on a condition obtained by comparing the provisional value and a boundary point between a plurality of ranges divided in accordance with an available charged amount of the battery;
a determiner that determines to which of the ranges the battery belongs based on the charge state of the battery derived by the second deriver; and
an instructor that instructs a control on charging and discharging of the battery in accordance with the region determined by the determiner, wherein
the boundary point is set based on a minimum required available charged amount for the battery belonging to at least one specific range of the ranges, and
the minimum required available charged amount is an available capacity of the battery when the battery is in a predetermined degradation state.

2. The battery managing device according to claim 1, wherein when the battery is determined to belong to the specific range, the instructor limits or disables charging of the battery.

3. The battery managing device according to claim 1, wherein when the battery is determined to belong to the specific range, the instructor limits or disables discharging of the battery.

4. The battery managing device according to claim 1, further comprising a third deriver that derives an open circuit voltage of the battery, wherein the first deriver derives the provisional value based on a relation between the open circuit voltage of the battery and the charge state of the battery from the open circuit voltage derived by the third deriver.

5. The battery managing device according to claim 1, wherein the second deriver derives the charge state of the battery based on an accumulated value of a charging-discharging current of the battery when the comparison between the boundary point and the provisional value judges that the battery belongs to the specific range.

6. The battery managing device according to claim 1, wherein the second deriver derives the charge state of the battery based on the provisional value and an accumulated value of a charging-discharging current of the battery when the comparison between the boundary point and the provisional value judges that the battery does not belong to the specific range.

7. The battery managing device according to claim 6, wherein the second deriver uses a larger ratio of derivation based on the provisional value for the provisional value closer to the boundary point when the battery is judged not to belong to the specific range.

8. The battery managing device according to claim 1, wherein the battery in the predetermined degradation state is in such a state that a value indicating the charge state of the battery being fully charged is less than or equal to half of a value indicating the charge state of the battery being fully charged when not degraded.

9. The battery managing device according to claim 1, wherein a relation between an open circuit voltage of the battery and the charge state of the battery varies depending on a degradation state of the battery.

10. The battery managing device according to claim 8, wherein the predetermined degradation state is a degradation state of the battery at a minimum allowable level.

11. The battery managing device according to claim 4, wherein the relation between the open circuit voltage of the battery and the charge state of the battery, which is used by the first deriver to derive the provisional value, is such a relation that the battery is in a degradation state with a smallest error in a value indicating the charge state with respect to the open circuit voltage between an initial state and the predetermined degradation state.

12. A vehicle comprising:
the battery managing device according to claim 1.

13. A battery managing method comprising the steps of:
deriving a provisional value indicating a charge state of a battery provided to a vehicle including an electric motor as a drive source;
deriving the charge state of the battery based on a condition obtained by comparing the provisional value and a boundary point between a plurality of ranges divided in accordance with an available charged amount of the battery;
determining to which of the ranges the battery belongs to based on the charge state of the battery derived by the deriving; and
controlling charging and discharging of the battery in accordance with the region determined by the determining, wherein
the boundary point is set based on a minimum required available charged amount for the battery belonging to at least one specific range of the ranges, and
the minimum required available charged amount is an available capacity of the battery when the battery is in a predetermined degradation state.

14. A battery managing device comprising:
a first calculator to calculate a provisional value indicating a charge state of a battery provided in a vehicle including an electric motor as a drive source;
a second calculator to calculate the charge state of the battery based on a condition obtained by comparing the provisional value and a boundary point which is on a boundary between a plurality of regions divided in accordance with an available charged amount of the battery, the boundary point being determined based on the available charged amount of the battery when the battery is in a predetermined degradation state;
a determiner to determine in which region among the regions the charge state of the battery is located; and
a controller to control charging and discharging of the battery in accordance with the region determined by the determiner.

15. The battery managing device according to claim 14, wherein when the battery is determined to belong to a specific region, the instructor limits or disables charging of the battery.

16. The battery managing device according to claim 14, wherein when the battery is determined to belong to a specific region, the instructor limits or disables discharging of the battery.

17. The battery managing device according to claim 14, further comprising a third calculator to calculate an open circuit voltage of the battery,
wherein the first calculator calculates the provisional value based on a relation between the open circuit voltage of the battery and the charge state of the battery from the open circuit voltage calculated by the third calculator.

18. The battery managing device according to claim 14, wherein the second calculator calculates the charge state of the battery based on an accumulated value of a charging-discharging current of the battery when the comparison between the boundary point and the provisional value judges that the battery belongs to a specific region.

19. The battery managing device according to claim 14, wherein the second calculator calculates the charge state of the battery based on the provisional value and an accumulated value of a charging-discharging current of the battery when the comparison between the boundary point and the provisional value judges that the battery does not belong to the a specific region.

20. The battery managing device according to claim 14,
wherein the boundary point is set based on a minimum required available charged amount for the battery belonging to at least one specific region of the regions, and the minimum required available charged amount is the available capacity of the battery in the predetermined degradation state belonging to the specific region.

21. The battery managing device according to claim 1, wherein the ranges are divided by a plurality of boundary points, the boundary points being constant values.

22. The battery managing method according to claim 13, wherein the ranges are divided by a plurality of boundary points, the boundary points being constant values.

23. The battery managing device according to claim 14, wherein the regions are divided by a plurality of boundary points, the boundary points being constant values.

\* \* \* \* \*